US011322205B2

(12) United States Patent
Park et al.

(10) Patent No.: US 11,322,205 B2
(45) Date of Patent: May 3, 2022

(54) NON-VOLATILE MEMORY DEVICE AND METHOD FOR PROGRAMMING THE SAME

(71) Applicant: Samsung Electronics Co., Ltd., Suwon-si (KR)

(72) Inventors: Sang-Won Park, Seoul (KR); Sang-Wan Nam, Hwaseong-si (KR); Ji Yeon Shin, Hwaseong-si (KR); Won Bo Shim, Seoul (KR); Jung-Yun Yun, Seoul (KR); Ji Ho Cho, Suwon-si (KR); Sang Gi Hong, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/823,275

(22) Filed: Mar. 18, 2020

(65) Prior Publication Data
US 2021/0027840 A1  Jan. 28, 2021

(30) Foreign Application Priority Data

Jul. 22, 2019  (KR) .................. 10-2019-0088372

(51) Int. Cl.
G11C 16/10 (2006.01)
G11C 16/04 (2006.01)
G11C 16/24 (2006.01)
G11C 16/08 (2006.01)
H01L 27/11582 (2017.01)
H01L 27/11556 (2017.01)

(52) U.S. Cl.
CPC .......... *G11C 16/10* (2013.01); *G11C 16/0483* (2013.01); *G11C 16/08* (2013.01); *G11C 16/24* (2013.01); *H01L 27/11556* (2013.01); *H01L 27/11582* (2013.01)

(58) Field of Classification Search
CPC ..... G11C 16/10; G11C 16/0483; G11C 16/08; H01L 27/11556; H01L 27/11582
USPC ...................................... 365/185.17
See application file for complete search history.

(56) References Cited

U.S. PATENT DOCUMENTS

| | | | |
|---|---|---|---|
| 7,085,157 B2 | 8/2006 | Tanaka et al. | |
| 7,715,235 B2 * | 5/2010 | Cernea | G11C 11/5628 365/185.19 |
| 7,764,542 B2 | 7/2010 | Edahiro et al. | |
| 8,023,312 B2 | 9/2011 | Yamazaki et al. | |
| 8,218,381 B2 | 7/2012 | Li | |
| 9,159,424 B2 | 10/2015 | Aritome | |
| 9,230,677 B2 | 1/2016 | Lee | |
| 9,263,137 B2 | 2/2016 | Lee | |
| 9,396,791 B2 | 7/2016 | Raghunathan et al. | |
| 9,406,393 B2 | 8/2016 | Parket et al. | |

(Continued)

Primary Examiner — Sung Il Cho
(74) Attorney, Agent, or Firm — Muir Patent Law, PLLC

(57) ABSTRACT

A method for programming a non-volatile memory device is provided. The method comprises applying a program word line voltage with a voltage level changed stepwise to a selected word line connected to a plurality of memory cells, and applying a program bit line voltage to a first bit line of a plurality of bit lines connected to a plurality of first memory cells, while the program word line voltage is applied to the selected word line. The program bit line voltage transitions from a first voltage level to one of a program inhibit voltage level, a program voltage level, and a second voltage level. The first and second voltage levels are between the program inhibit voltage level and program voltage level.

19 Claims, 12 Drawing Sheets

(56) References Cited

U.S. PATENT DOCUMENTS

| | | |
|---|---|---|
| 9,466,389 B2 | 10/2016 | Ahn |
| 9,633,732 B2 | 4/2017 | Lee |
| 9,767,909 B1 | 9/2017 | Yip |
| 9,842,657 B1 | 12/2017 | Dutta et al. |
| 9,947,418 B2 | 4/2018 | Helm et al. |
| 10,037,797 B2 | 7/2018 | Tang et al. |
| 10,795,762 B2 | 10/2020 | Gim |
| 10,937,503 B2 | 3/2021 | Lee et al. |
| 2004/0240269 A1* | 12/2004 | Cernea ................ G11C 11/5628 365/185.12 |
| 2006/0039198 A1* | 2/2006 | Guterman .......... G11C 16/3454 365/185.28 |
| 2008/0094902 A1* | 4/2008 | Lee .................... G11C 16/3427 365/185.17 |
| 2008/0279012 A1* | 11/2008 | Lee ....................... G11C 16/10 365/185.19 |
| 2009/0323432 A1* | 12/2009 | Futatsuyama ...... G11C 16/3454 365/185.22 |
| 2010/0259995 A1* | 10/2010 | Joo ........................ G11C 16/26 365/185.25 |
| 2011/0069546 A1 | 3/2011 | Watanabe |
| 2011/0267895 A1* | 11/2011 | Lee ..................... G11C 11/5628 365/185.25 |
| 2012/0020155 A1* | 1/2012 | Kim ................... G11C 11/5628 365/185.03 |
| 2012/0287720 A1* | 11/2012 | Choi ..................... G11C 16/10 365/185.19 |
| 2013/0135937 A1 | 5/2013 | Sakui |
| 2013/0182505 A1* | 7/2013 | Liu ....................... G11C 16/10 365/185.17 |
| 2013/0322171 A1* | 12/2013 | Lee ....................... G11C 29/04 365/185.03 |
| 2018/0053568 A1* | 2/2018 | Yamauchi ................ G11C 7/20 |
| 2019/0088312 A1 | 3/2019 | Shiino |
| 2019/0362799 A1* | 11/2019 | Yang .................. G11C 16/3459 |
| 2020/0202964 A1* | 6/2020 | Sako ................. G11C 11/5671 |

* cited by examiner

NON-VOLATILE MEMORY DEVICE AND METHOD FOR PROGRAMMING THE SAME

This application claims priority to Korean Patent Application No. 10-2019-0088372 filed on Jul. 22, 2019 in the Korean Intellectual Property Office, the disclosure of which is incorporated herein by reference in its entirety.

BACKGROUND

1. Technical Field

The present invention relates to a non-volatile memory device and a method for programming the non-volatile memory device.

2. Description of the Related Art

A memory device is a storage device that may store data and read the data when needed. The memory device may be largely divided into a non-volatile memory (NVM) in which stored data is not lost even if power is not supplied, and a volatile memory (VM) in which stored data is lost if power is not supplied.

In order to control a plurality of memory cells disposed inside the memory device, various wirings may be disposed and used inside the memory device. Examples of the wirings may include a word line, a bit line and the like connected to the memory cells.

In order to program the memory cell, the memory cell may be programmed by applying various types of program voltages to the word line and the bit line connected to the memory cell to be programmed. Incidentally, when a program is executed after setting various types of program voltages for each memory cell to be programmed, a time period required for the program may be increased. Therefore, there is a need for research for improving the time period increase.

SUMMARY

Aspects of the present invention provide a non-volatile memory device in which the time period required for programming a memory cell is shortened and the operation performance is improved.

Aspects of the present invention also provide a method for programming a non-volatile memory device in which the time period used for programming a memory cell is shortened and the operation performance is improved.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present inventive concept, there is provided a method for programming a non-volatile memory device comprises applying a program word line voltage with a voltage level changed stepwise to a selected word line connected to a plurality of memory cells, the program word line voltage including a first voltage level during a first time interval and a second voltage level different from the first voltage level during a subsequent second time interval, and applying a program bit line voltage to a first bit line of a plurality of bit lines connected to a plurality of first memory cells, while the program word line voltage is applied to the selected word line, when the program bit line voltage has a program inhibit voltage level, inhibiting the plurality of first memory cells from programming, and when the program bit line voltage has a program voltage level, programming the plurality of first memory cells. The program bit line voltage has a third voltage level between the program inhibit voltage level and the program voltage level during the first time interval, and one of the program inhibit voltage level, the program voltage level, and a fourth voltage level between the program inhibit voltage level and the program voltage level during the subsequent second time interval.

According to an aspect of the present inventive concept, there is provided a method for programming a non-volatile memory device comprises applying a program word line voltage with a voltage level changed stepwise to a selected word line connected to a plurality of memory cells, the program word line voltage including a first voltage level during a first time interval and a second voltage level different from the first voltage level during a subsequent second time interval, applying a first program bit line voltage to a first bit line of a plurality of bit lines connected to a plurality of first memory cells, while the program word line voltage is applied to the selected word line, when the first program bit line voltage has a program inhibit voltage level, inhibiting the plurality of first memory cells from programming, and when the first program bit line voltage has a program voltage level, programming the plurality of first memory cells. The first program bit line voltage has the program inhibit voltage level during the first time interval, and one of a third voltage level and a fourth voltage level between the program inhibit voltage level and the program voltage level during the subsequent second time interval.

According to an aspect of the present inventive concept, there is provided a method for programming a non-volatile memory device comprises applying a program word line voltage with a voltage level changed stepwise to a selected word line connected to a plurality of memory cells, the program word line voltage including a first voltage level during a first time interval and a second voltage level different from the first voltage level during a subsequent second time interval, applying a first program bit line voltage to a first bit line of a plurality of bit lines connected to a plurality of first memory cells, while the program word line voltage is applied to the selected word line, when the first program bit line voltage has a program inhibit voltage level, inhibiting the plurality of first memory cells from programming, when the first program bit line voltage has a program voltage level, programming the plurality of first memory cells, and turning off a string selection transistor connected to the plurality of first memory cells before the first program bit line voltage transitions to the program voltage level.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Embodiments according to the technical idea of the present invention will be described below with reference to the accompanying drawings.

Figure 1:
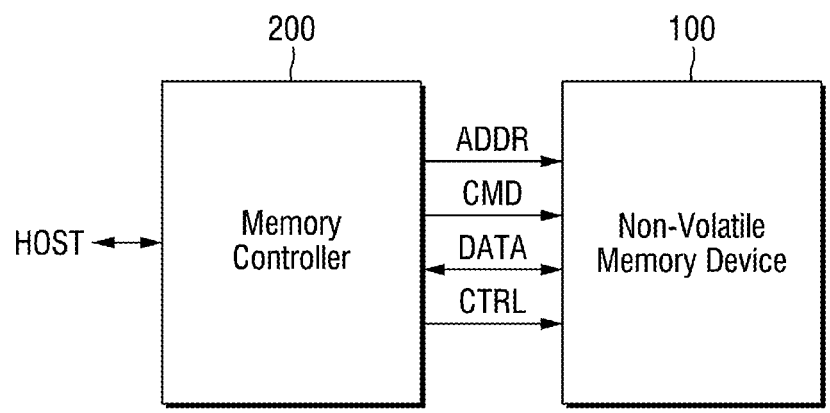
FIG. 1 is a block diagram for explaining a non-volatile memory system according to some embodiments.

FIG. 1 is a block diagram for explaining a non-volatile memory system according to some embodiments.

Referring to FIG. 1, the non-volatile memory system 10 includes a memory controller 200 and a non-volatile memory device 100. Although examples of the non-volatile memory system 10 shown in FIG. 1 may include data storage media based on a flash memory, such as a memory card, a USB memory, and an SSD (Solid State Drive), embodiments are not limited thereto.

The memory controller 200 may be connected to a host and the non-volatile memory device 100. As shown, the memory controller 200 may be configured to access the non-volatile memory device 100 in response to a request from the host HOST. The memory controller 200 may be configured to provide an interface between the non-volatile memory device 100 and the host HOST. Also, the memory controller 200 may also be configured to drive firmware for controlling the non-volatile memory device 100.

The memory controller 200 may control the operation of the non-volatile memory device 100. Specifically, the memory controller 200 may provide a command CMD, an address ADDR, a control signal CTRL, and data DATA along an input/output line connected to the non-volatile memory device 100. The address ADDR may include a row address and a column address.

Although the control signal CTRL provided by the memory controller 200 to the non-volatile memory device 100 may include, for example, a chip enable CE, a write enable WE, a read enable RE, and the like, the embodiments are not limited thereto.

The memory controller 200 may also include an ECC circuit that corrects error bits. The ECC circuit may correct error bits included in the data. However, the embodiments are not limited thereto, the ECC circuit may be provided as a constituent element of the non-volatile memory device 100 as necessary.

In some examples, each of the memory controller 200 and the non-volatile memory device 100 may be provided as one chip, one package, one module, or the like. In some examples, the memory controller 200 and the non-volatile memory device 100 may be mounted using a package such as a PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP) and Wafer-Level Processed Stack Package (WSP).

Hereinafter, the configuration of the non-volatile memory device 100 will be described more specifically with reference to FIG. 2.

Figure 2:
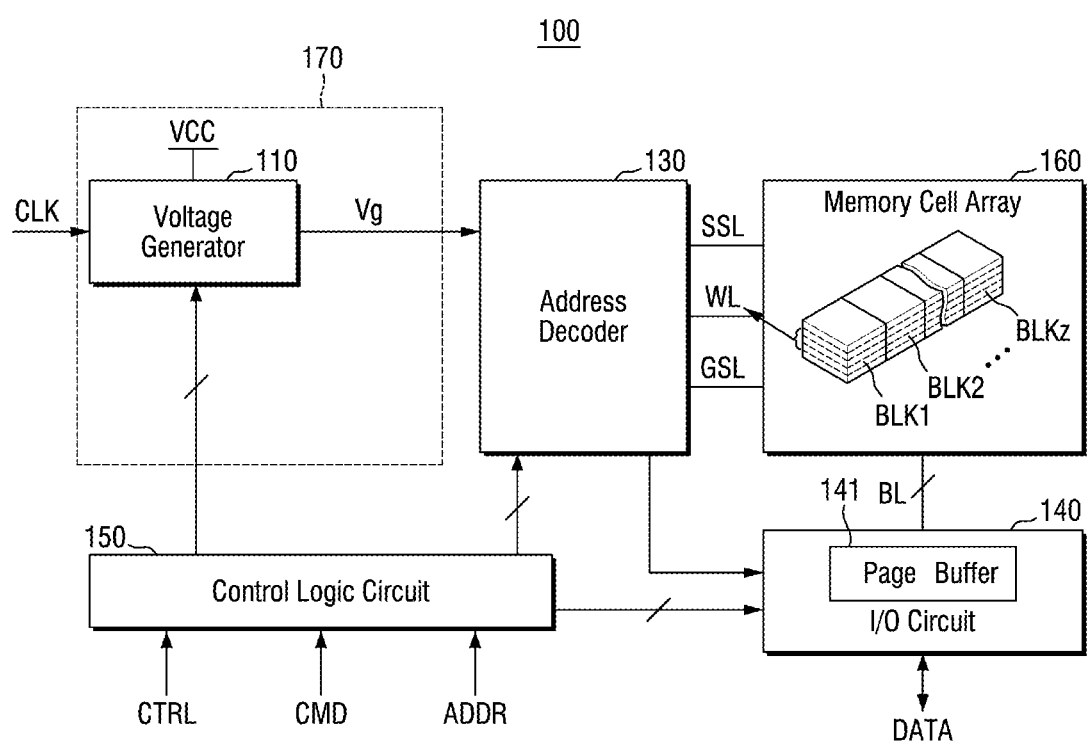
FIG. 2 is a block diagram for explaining the non-volatile memory device of FIG. 1.

FIG. 2 is a block diagram for explaining the non-volatile memory device of FIG. 1.

Referring to FIG. 2, the non-volatile memory device 100 may include a voltage generator 110, an address decoder 130, an input/output (I/O) circuit 140, a control logic circuit 150, and a memory cell array 160.

Although the non-volatile memory device 100 may include, for example, a NAND flash memory, a vertical NAND (VNAND) flash memory, a NOR flash memory, a Resistive Random Access Memory (RRAM), a Phase-Change Memory (PRAM), a Magneto resistive Random Access Memory (MRAM), a Ferroelectric Random Access Memory (FRAM), a Spin Transfer Torque Random Access Memory (STT-RAM) and the like, the embodiments are not limited thereto.

Hereinafter, although the technical idea of the present invention will be described by taking an example in which the non-volatile memory device 100 is a VNAND flash memory, the technical idea of the present invention is not limited thereto. For example, the embodiments according to the technical idea of the present invention may be freely applied to the non-volatile memories described above.

The voltage generator 110 may generate an operating voltage Vg necessary for the operation of the non-volatile memory device 100, using a power supply voltage Vcc. Although examples of the operating voltages Vg may include a program voltage, a pass voltage, a read voltage, a read pass voltage, a verification voltage, an erase voltage, a common source line voltage, a well voltage, and the like, the embodiments are not limited thereto.

The voltage generator 110 may program new data in a memory cell arranged in the memory cell array 160, may read data stored in the memory cell, or may generate word line voltage necessary for erasing data stored in the memory cell.

In some embodiments, at a word line voltage (hereinafter referred to as a program word line voltage) generated by the voltage generator 110 to program new data in the memory cells arranged in the memory cell array 160 is programmed, for example, a voltage level thereof may be changed stepwise to improve the program operation speed. Specifically, the program word line voltage may be generated such that its voltage level decreases stepwise. However, the embodiments are not limited thereto, and the form thereof may be modified freely. In some embodiments, the program word line voltage may be generated such that its voltage level increases stepwise. This will be described in more detail later.

The address decoder 130 may select one of a plurality of memory blocks BLK1 to BLKz in response to the address ADDR. Also, the address decoder 130 may be connected to the memory cell array 160 through the plurality of word lines WL, at least one string selection line SSL and at least one ground selection line GSL.

The address decoder 130 may select one of the plurality of word lines WL, the string selection line SSL, and the ground selection line GSL, using a decoded row address. Also, the address decoder 130 may decode a column address among the address ADDR. Here, the decoded column address may be transmitted to the I/O circuit 140. In some embodiments, the address decoder 130 may include a row decoder, a column decoder, an address buffer, and the like.

The I/O circuit 140 may be connected to the memory cell array 160 through a plurality of bit lines BL. The I/O circuit 140 may be implemented to receive the decoded column address from the address decoder 130. The I/O circuit 140 may select one or more bit lines of the plurality of bit lines BL, using the decoded column address.

The I/O circuit 140 may include a plurality of page buffers 141 that stores data to be programmed when executing a program operation by the non-volatile memory device 100 or stores read data when executing a read operation. Here, each of the plurality of page buffers 141 may include one or more latches.

During a time period of the program operation, data stored in the plurality of page buffers 141 may be programmed to a page (for example, a set of memory cells) corresponding to the selected memory block through the bit line BL. Data read from the page corresponding to the selected memory block during a time period of the read operation may be stored in the page buffer 141 through the bit line BL.

In some embodiments, information about cells in which a forcing voltage is applied to the bit line in a previous program loop among the memory cells included in the memory cell array 160 may be temporarily stored in the plurality of page buffers 141.

During the time period of the program operation, when the address decoder 130 applies the program word line voltage to the selected word line WL, the I/O circuit 140 operates as a write driver, and may apply a program bit line voltage, such as a program inhibit voltage, a program forcing voltage, and a program voltage, to the bit lines BL connected to the memory cell. However, the embodiments are not limited thereto, and the shown configuration may be implemented with various modifications.

In some examples, the I/O circuit 140 may also read data from a first region of the memory cell array 160 and store the read data in a second region of the memory cell array 160. For example, the I/O circuit 140 may be implemented to perform copy-back.

The control logic circuit 150 may control the overall operations (program, read, erase, etc.) of the non-volatile memory device 100. Specifically, the control logic circuit 150 may control the operation of the voltage generator 110, the address decoder 130, and the I/O circuit 140 while the non-volatile memory device 100 operates. The control logic circuit 150 may operate in response to control signals CTRL or commands that are input from outside the non-volatile memory device 100. Although only a configuration in which the control logic circuit 150 controls the operation of the voltage generator 110, the address decoder 130, and the I/O circuit 140 is shown in the drawings, the embodiments are not limited thereto. If required, the non-volatile memory device 100 may include more constituent elements in addition to the shown constituent elements, and the control logic circuit 150 may control the overall operations of the constituent elements.

The memory cell array 160 may be implemented, for example, as a three-dimensional memory array structure. The three-dimensional memory array has directionality in a vertical direction, and may include a plurality of vertical NAND strings in which at least one memory cell is located on the other memory cell. The at least one memory cell may include, for example, a charge trap layer. Each vertical NAND string may include at least one selection transistor located above the memory cells. The at least one selection transistor has the same structure as the memory cells and may be formed monolithically together with the memory cells. The term "monolithically" means a configuration in which layers of each level of the three-dimensional array are deposited directly over the layers of the lower level of the three-dimensional array.

The three-dimensional memory array may be made up of a plurality of levels, and shared word lines or bit lines may be disposed between the levels. The non-volatile memory device 100 may be a flash memory device in which the charge storage layer is made up of a conductive floating gate, or may be a charge trap flash (CTF) memory device in which the charge storage layer is made up of an insulating film. Hereinafter, an example in which the non-volatile memory device 100 is a vertical NAND flash memory device will be described.

The memory cell array 160 may include a plurality of memory blocks BLK1 to BLKz. Each of the memory blocks BLK1 to BLKz may be connected to the address decoder 130 through a plurality of word lines WL, at least one string selection line SSL and at least one ground selection line GSL, and may be connected to the I/O circuit 140 through a plurality of bit lines BL. In some embodiments, the plurality of word lines WL may have a stacked plate-like structure.

Each of the plurality of memory blocks BLK1 to BLKz may include a plurality of strings having a three-dimensional structure arranged on the substrate along the first direction and a second direction different from the first direction, and arranged in a third direction perpendicular to a plane formed by the first and second directions. Here, each of the plurality of strings may be made up of at least one string selection transistor serially connected between a bit line and a common source line (CSL), a plurality of memory cells, and at least one ground selection transistor. Here, each of the plurality of memory cells may store at least one bit. In some embodiments, at least one dummy cell may be included between the at least one string selection transistor and the plurality of memory cells. In some embodiments, at least one dummy cell may be included between the plurality of memory cells and the at least one ground selection transistor. Hereinafter, the memory blocks BLK1 to BLKz of the memory cell array 160 will be described more specifically with reference to FIGS. 3 and 4.

Figure 3:
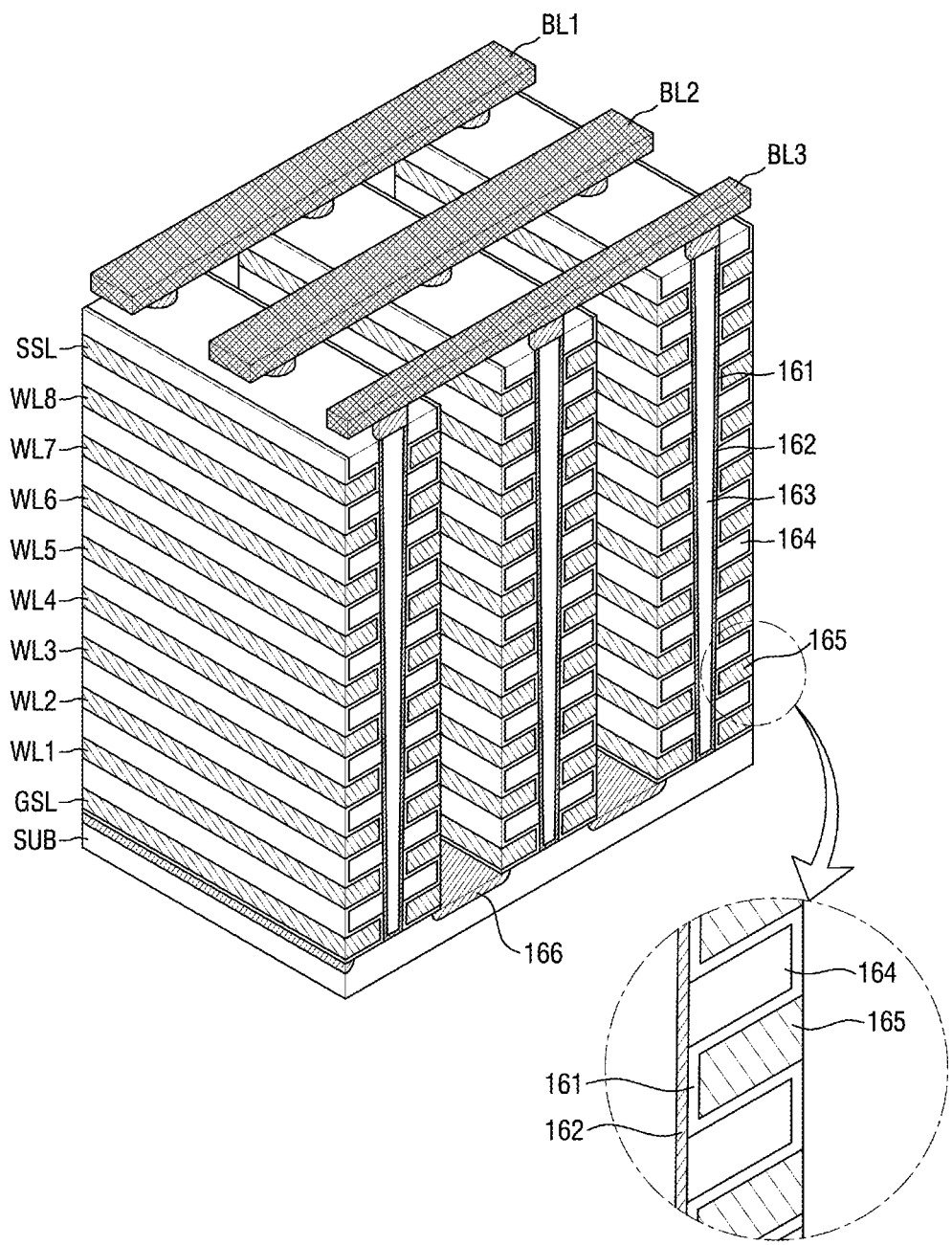
FIGS. 3 and 4 are diagrams for explaining a memory cell array of FIG. 2.
Figure 4:
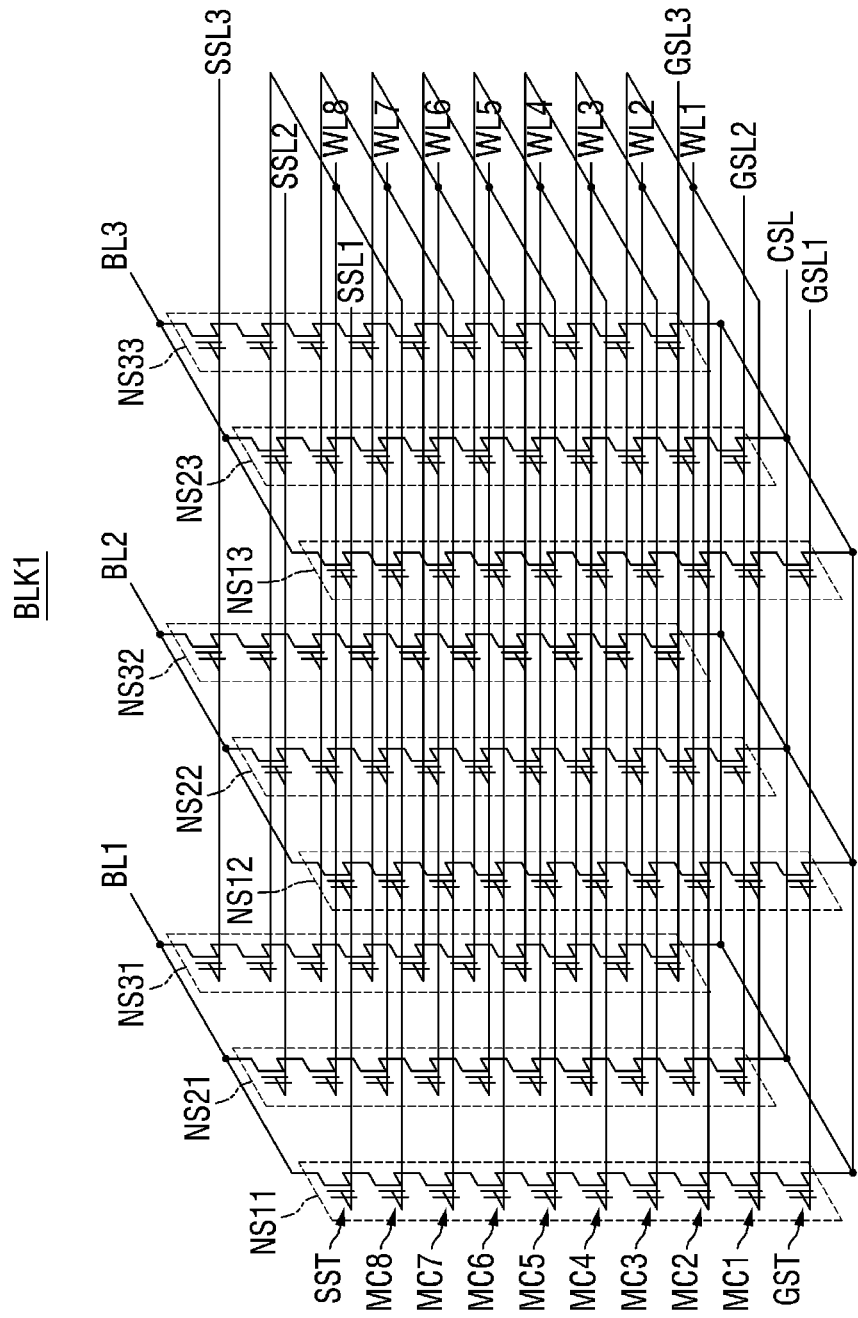

FIGS. 3 and 4 are diagrams for explaining the memory cell array of FIG. 2.

Referring to FIG. 3, a memory block BLK1 may be formed in a direction perpendicular to a substrate SUB. For example, an n+ doping region 166 including impurities may be formed in the substrate SUB. The doping region 166 may be used, for example, as a common source line (CSL of FIG. 4).

Gate electrodes 165 and insulating films 164 may be alternately stacked on the substrate SUB. A data storage film 161 may be formed between the gate electrode 165 and the insulating film 164.

A pillar may penetrate the gate electrode 165 and the insulating film 164 in the vertical direction. The pillar may be formed in a V shape as shown. The pillar may pass through the gate electrode 165 and the insulating film 164 and may be connected to the substrate SUB. The inside of the pillar may be made up of an insulating material such as silicon oxide with a charging dielectric pattern 163. The outside of the pillar may be made up of a channel semiconductor with a vertical active pattern 162.

The gate electrode 165 of the memory block BLK1 may be connected to the ground selection line GSL, the plurality of word lines WL1 to WL8, and the string selection line SSL. The vertical active pattern 162 formed outside the pillar of the memory block BLK1 and used as the channel may be connected to a plurality of bit lines BL1 to BL3. Although one memory block BLK1 is shown to have eight word lines WL1 to WL8 and three bit lines BL1 to BL3 in FIG. 3, the embodiments are not limited thereto. If necessary, the number of wirings may be implemented with various modifications.

FIG. 4 is an exemplary equivalent circuit diagram of the memory block BLK1. Referring to FIG. 4, cell strings NS11 to NS33 may be disposed between the bit lines BL1 to BL3 and the common source line CSL. Each cell string (e.g., NS11) may include a ground selection transistor GST, a plurality of memory cells MC1 to MC8 and a string selection transistor SST.

The string selection transistor SST may be connected to a string selection line SSL. The string selection line SSL may be separated into first to third string selection lines SSL1 to SSL3. The ground selection transistor GST may be connected to the ground selection lines GSL1 to GSL3. In some embodiments, the ground selection lines GSL1 to GSL3 may be connected to each other. The string selection transistor SST may be connected to the bit line BL, and the ground selection transistor GST may be connected to the common source line CSL. Although each of the string selection transistor SST and the ground selection transistor GST is formed as the same type of transistor as each of the plurality of memory cells MC1 to MC8 embodiments are not limited thereto. In some examples, each of the string selection transistor SST and the ground selection transistor GST is formed as a different type of transistor from each of the plurality of memory cells MC1 to MC8.

The plurality of memory cells MC1 to MC8 may be connected to the corresponding word lines WL1 to WL8, respectively. A set of memory cells connected to one word line and programmed during the same time period may be called a page. As shown, the memory block BLK1 may include a plurality of pages. In addition, a plurality of pages may be connected to one word line. Referring to FIG. 4, a word line (e.g., WL4) having the same height from the common source line CSL may be commonly connected to three pages.

The pages may be units of data programming and reading, and the memory block BLK1 may be a unit of data erasing. For example, when the non-volatile memory device performs a program or read operation, data of page units may be programmed or read. When the non-volatile memory device performs an erase operation, data may be erased in memory block units. For example, data stored in all the memory cells MC1 to MC8 included in one memory block may be erased at the same time.

In some examples, each of the memory cells MC1 to MC8 may store one bit of data or data of two bits or more. A memory cell that may store data of one bit in one memory cells MC1 to MC8 may be called a single level cell (SLC) or a single bit cell. A memory cell that may store data of two bits or more in one memory cell may be called a multi-level cell (MLC) or a multi-bit cell. In the case of 2-bit MLC, two page data may be stored in one physical page. For example, two page data may be stored in the memory cell MC4 connected to the word line WL4. In some embodiments, each of the memory cells MC1 to MC8 may store data of three bits or more. In this case, three or more page data may be stored in one physical page.

Hereinafter, the program operation of the non-volatile memory device according to some embodiments will be described with reference to FIGS. 1, 4, and 5 to 10.

Figure 5:
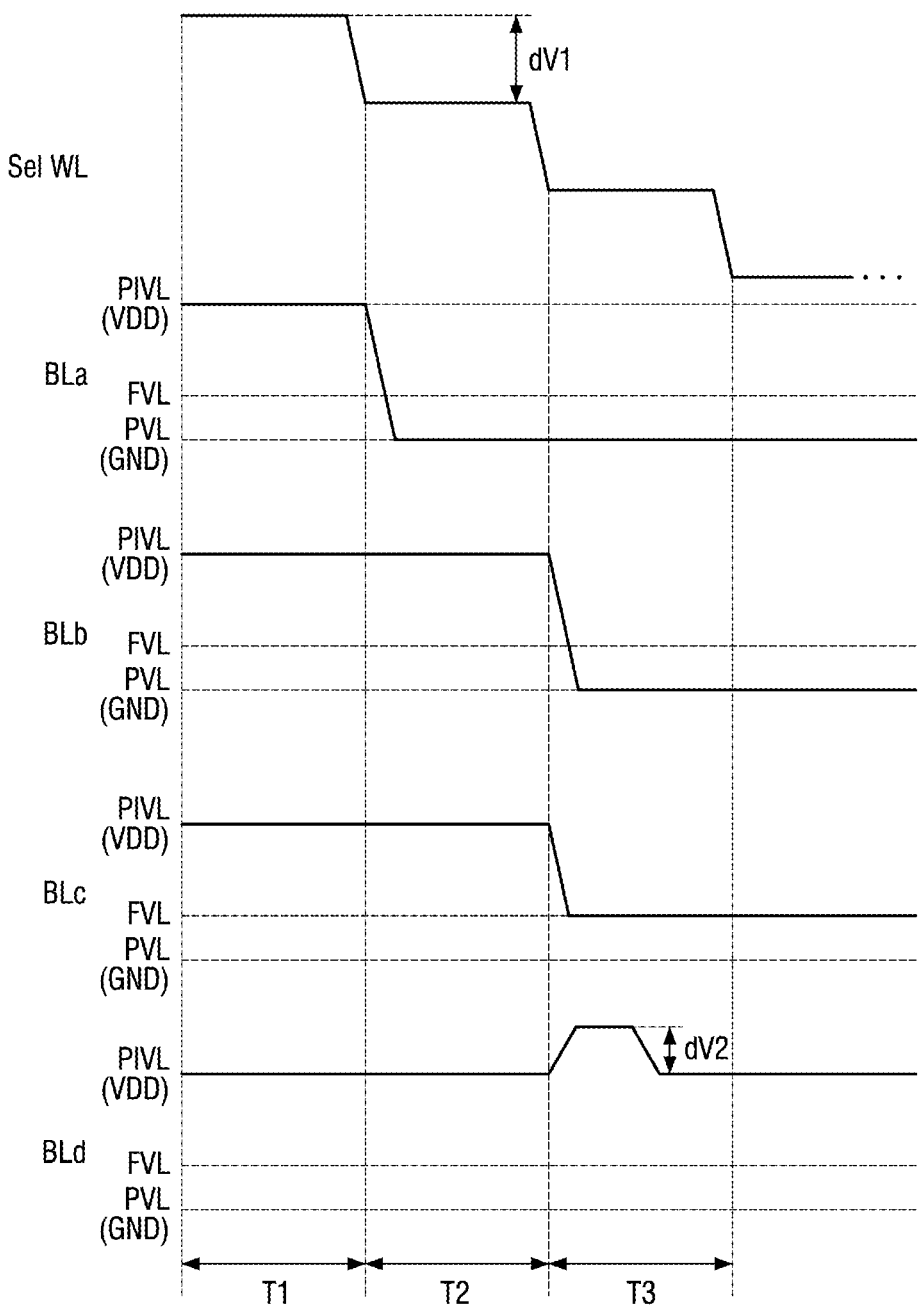
FIG. 5 is a timing diagram for explaining a program operation of the non-volatile memory device according to some embodiments.

FIG. 5 is a timing diagram for explaining a program operation of the non-volatile memory device according to some embodiments. FIGS. 6 to 9 are diagrams for explaining the program operation of the non-volatile memory device shown in FIG. 5 according to some embodiments. FIG. 10 is a timing diagram for explaining a program operation of the non-volatile memory device according to some embodiments.

Referring to FIGS. 1, 4 and 5, the control logic circuit 150 may perform a control to apply a program word line voltage with a voltage level changed stepwise to a word line (WLm, hereinafter m is a natural number) connected to a memory cell (MCn, hereinafter n is a natural number) to be programmed, that is, the selected word line WLm.

Hereinafter, although an example in which the program word line voltage decreases by a first voltage level difference dV1 will be described, the embodiments are not limited thereto. That is, the control logic circuit 150 may perform a control to apply a program word line voltage with a voltage level decreased stepwise to the selected word line WLm.

When such a program word line voltage is applied to the selected word line WLm, various program operations may be executed on the selected memory cell MCn, using each time interval (T1 to T3 of FIG. 5 and T11 to T14 of FIG. 10) of the program word line voltage. In some embodiments, in order to execute various program operations on the selected memory cell MCn, rather than newly setting up the program word line voltage every time, by applying program word line voltages having voltage levels different from each other to the selected word line WLm for each time interval (T1 to T3 of FIG. 5 and T11 to T14 of FIG. 10) after one setting-up as shown, the program execution time can be shortened effectively, while executing various program operations. In some embodiments, in order to execute various program operations, in each time interval (T1 to T3 of FIG. 5 and T11 to T14 of FIG. 10) to which the program word line voltage is applied, the program bit line voltage applied to the bit line (BLq, where q is a natural number) is controlled. This will be described more specifically below.

In some examples, the program execution time may be a time period corresponding to the first to third time intervals T1 to T3.

In some examples, the program execution time may be a time period corresponding to the fourth to seventh time intervals T11 to T14.

In some examples, the program execution time may be a time period corresponding to the first to third time intervals T1 to T3, and the fourth to seventh time intervals T11 to T14.

Referring to FIG. 5, a program bit line voltage having a program inhibit voltage level PIVL is applied to the bit lines BLa, BLb, BLc and BLd in the first time interval T1. As a result, no program operation is executed on the memory cells MCn connected to the bit lines BLa, BLb, BLc and BLd.

In some embodiments, the program inhibit voltage level PIVL may be the same as, for example, a power supply voltage VDD level. However, the embodiments are not limited thereto, and the program inhibit voltage level PIVL may be modified variously to be different from this case.

Referring to FIG. 5 again, in the second time interval T2, a program bit line voltage having the program inhibit voltage level PIVL is applied to the bit lines BLb, BLc and BLd. However, the program bit line voltage applied to the bit line BLa transitions from the program inhibit voltage level PIVL to a program voltage level PVL. As a result, although no program operation is executed on the memory cell MCn connected to the bit lines BLb, BLc and BLd, the program operation is executed on the memory cell MCn connected to the bit line BLa.

In some embodiments, the program voltage level PVL may be the same as, for example, a ground voltage GND level. However, the embodiments are not limited thereto, and the program voltage level GND may be modified freely to be different from this case.

Figure 6:
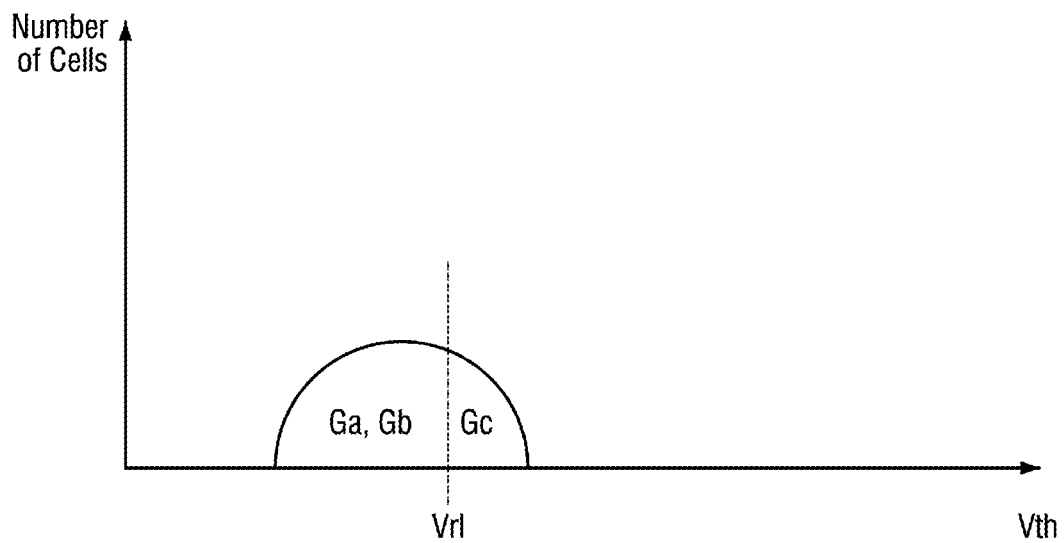
FIGS. 6 to 9 are diagrams for explaining the program operation of the non-volatile memory device shown in FIG. 5 according to some embodiments.
Figure 7:
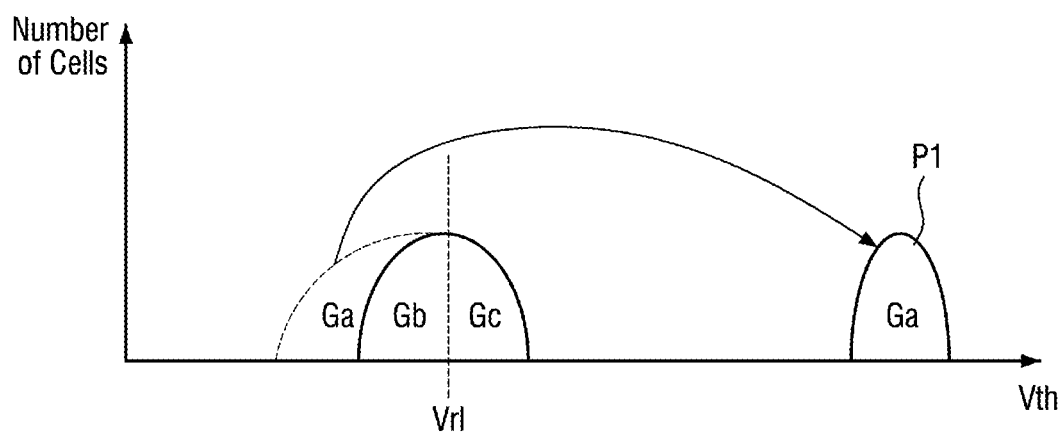
Figure 8:
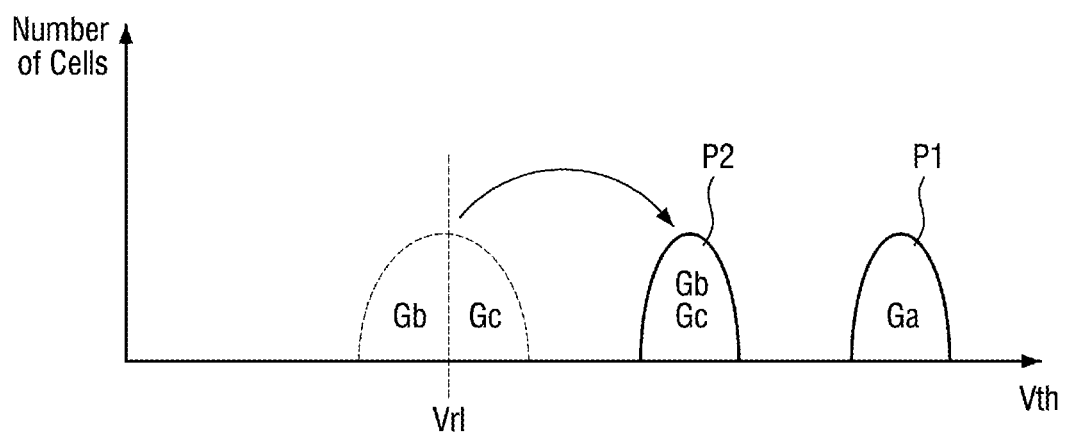

Referring to FIGS. 5, 6 and 7 together, in the second time interval T2, memory cells MCn included in the memory cell group Ga connected to the bit line BLa may be programmed to a first program state P1 by the program word line voltage and the program bit line voltage shown in FIG. 5.

Referring to FIG. 5 again, in the third time interval T3, the program bit line voltage applied to the bit line BLb transitions from the program inhibit voltage level PIVL to the program voltage level PVL. Further, the program bit line voltage applied to the bit line BLc transitions from the program inhibit voltage level PIVL to a voltage level between the program inhibit voltage level PIVL and the program voltage level PVL. In some embodiments, the bit lines BLb and BLc may be disposed adjacent to each other.

In some embodiments, the program bit line voltage to be applied to the bit line BLc may be a forcing voltage level FVL which is applied to the bit line BLc to improve the threshold voltage dispersion of the memory cell MCn connected to the bit line BLc. However, the embodiments are not limited thereto, and this may be implemented with various modifications.

As a result, the program operation is executed on the memory cells MCn connected to the bit lines BLb and BLc.

Referring to FIGS. 5, and 6 to 8 together, in the third time interval T3, memory cells MCn included in the memory cell group Gb connected to the bit line BLb having a threshold voltage lower than a predetermined threshold voltage Vr1 may be programmed to a second program state P2 by the program word line voltage and the program bit line voltage in FIG. 5. In addition, memory cells MCn included in the memory cell group Gc connected to the bit line BLc having a threshold voltage higher than a predetermined threshold voltage Vr1 may also be programmed to the second program state P2 by the program word line voltage and the program bit line voltage in FIG. 5. Here, the forcing voltage level FVL of the program bit line voltage applied to the memory cells MCn included in the memory cell group Gc may be implemented with various modifications in accordance with the dispersion of the memory cells MCn included in the memory cell group Gb and the memory cells MCn included in the memory cell group Gc. In some examples, the forcing voltage level FVL may be implemented with various modifications even in program examples different from the shown example.

Referring to FIG. 5 again, in the third time interval T3, the program bit line voltage applied to the bit line BLd transitions from the program inhibit voltage level PIVL to a voltage level higher than the program inhibit voltage level PIVL. In some embodiments, the program bit line voltage applied to the bit line BLd may transition to a voltage level that is higher than the program inhibit voltage level PIVL by a second voltage level difference dV2. After a certain period of time elapses, the program bit line voltage to be applied to the bit line BLd may transition to the program inhibit voltage level PIVL as shown.

As a result, although no program operation is executed on the memory cell MCn connected to the bit line BLd, it is possible to minimize an influence (e.g., a coupling effect) on the memory cells MCn connected to the bit line BLd, while the level of the program bit line voltage applied to the adjacent bit line BLb decreases. Hereinafter, this will be described more specifically with reference to FIG. 9.

Figure 9:
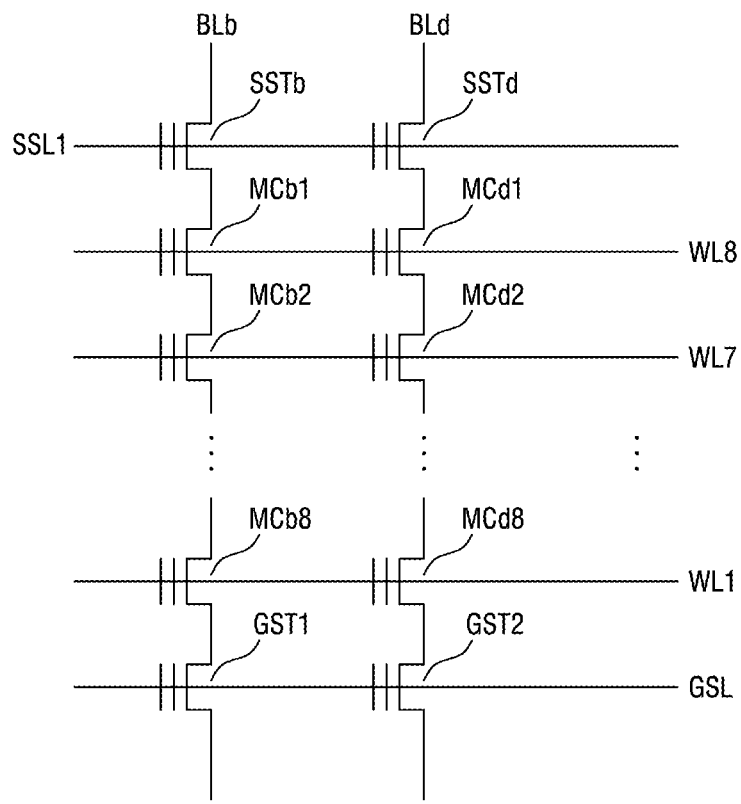
Figure 9:
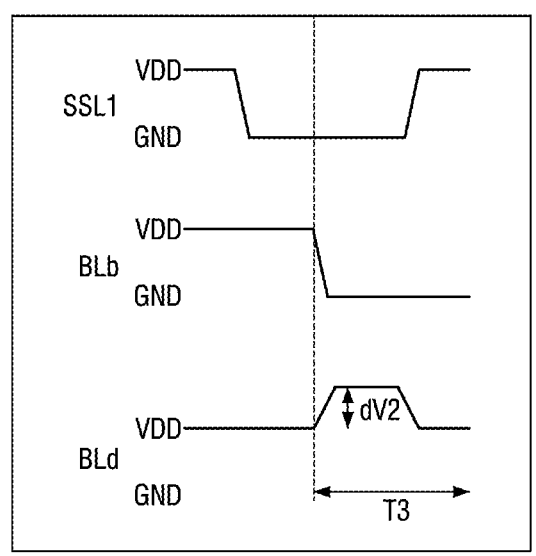
Figure 10:
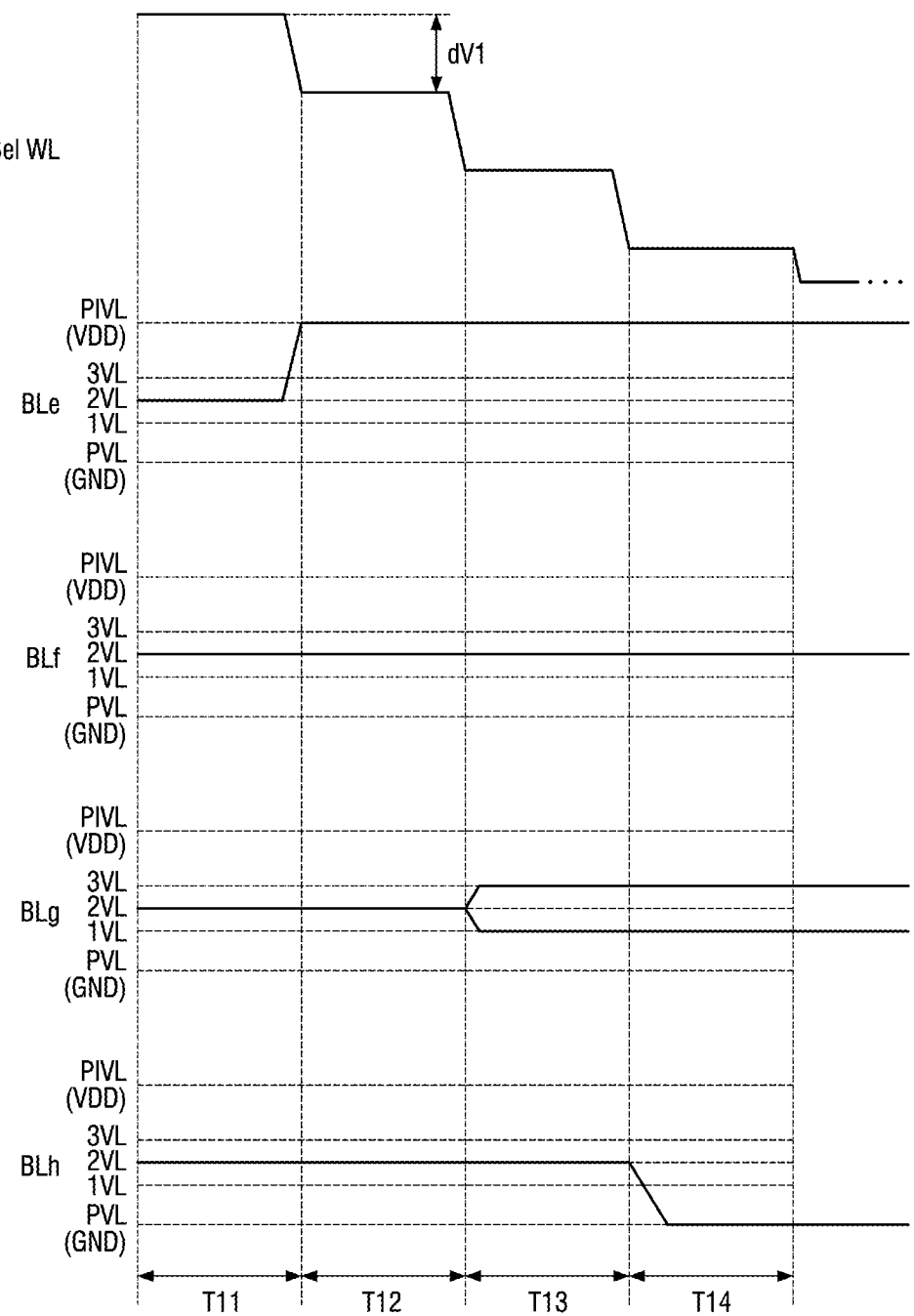
FIG. 10 is a timing diagram for explaining a program operation of the non-volatile memory device according to some embodiments.

Referring to FIG. 9, when the bit line BLb and the bit line BLd are disposed to be adjacent to each other as shown in FIG. 9, if the level of the program bit line voltage applied to the bit line BLb in the third time interval T3 decreases, the memory cells MCn connected to the bit line BLd may be influenced by the coupling effect. Accordingly, in the present embodiment, in order to minimize such a coupling effect, when the level of the program bit line voltage applied to the bit line BLb decreases, the coupling effect can be prevented by increasing the voltage level of the program bit line voltage to be applied to the bit line BLd adjacent thereto by a second voltage level difference dV2.

In some embodiments, the coupling effect occurring between the bit line BLb and the bit line BLd arranged adjacent to each other in this way may also be prevented by controlling the control signal to be applied to the string selection line SSL1. For example, the coupling effect may be minimized, by turning off selection transistors SSTb and SSTd connected to the bit line BLb and the adjacent bit line BLd, respectively, before the level of the program bit line voltage to be applied to the bit line BLb decreases (that is, before a third time interval T3) to prevent the channels connected to the bit line BLb and the adjacent bit line BLd from coupling. In some examples, by turning off selection transistors SSTb and SSTd before the level of the program bit line voltage to be applied to the bit line BLb decreases to the program voltage level (e.g., GND), prevent the bit line voltage connected to the adjacent bit line BLd (i.e., no program memory cells) from some leakage. Thereafter, the selection transistors SSTb and SSTd may be turned on again subsequent to a certain period of time after the voltage level of the program bit line voltage to be applied to the bit line BLd decreases by the second voltage level difference dV2 (i.e., decreases to the program inhibit voltage level). Although FIG. 9 shows an embodiment in which the voltage level of the string selection signal to be applied to the string selection line SSL1 transitions as a method of turning off the selection transistors SSTb and SSTd connected to the bit line BLb and the bit line BLd, respectively, the embodiments are not limited thereto.

Referring to FIG. 10, in a fourth time interval T11, the program bit line voltage to be applied to a bit line BLe transitions from a second voltage level 2VL to a program inhibit voltage level PIVL. As a result, for example, boosting on the memory cell MCn may be maintained so that the memory cells MCn connected to the bit line BLe and programmed to a specific program state are not influenced by other program operations.

Although the first to third time intervals T1 to T3 and the fourth to seventh time intervals T11 to T14 are shown separately in FIGS. 5 and 10 for convenience of explanation, the configurations shown in FIGS. 5 and 10 are not implemented dividedly in separate embodiments. That is to say, while the program word line voltage with the voltage level decreased stepwise is continuously applied to the selected word line WLm as shown, the program bit line voltage may variously transition in the bit lines BLa to BLh as shown in the first to third time intervals T1 to T3 of FIG. 5 and the fourth to seventh time intervals T11 to T14 of FIG. 10. At this time, there is no order relation according to a time sequence between each of the time intervals T1 to T3 and T11 to T14, and first to third time intervals T1 to T3 of FIG. 5 and fourth to seventh time intervals T11 to T14 of FIG. 10 will be described sequentially for convenience of explanation in the present specification.

In some embodiments, all the first to third voltage levels 1VL to 3VL shown in FIG. 10 may have voltage levels between the program inhibit voltage level PIVL and the program voltage level PVL. In some embodiments, although the second voltage level 2VL may be the aforementioned forcing voltage level (FVL of FIG. 5), embodiments are not limited thereto. In some embodiments, each of the first and third voltage levels 1VL and 3VL may also be the forcing voltage level. In some embodiments, the third voltage level 3VL may be a voltage level having a voltage higher than the second voltage level 2VL, and the first voltage level 1VL may be a voltage level having a voltage lower than the second voltage level 2VL.

Referring to FIG. 10 again, in the fifth time interval T12, the program bit line voltage to be applied to the bit line BLf maintains the second voltage level 2VL. Accordingly, for example, a fine program may be continuously executed on the memory cells MCn connected to the bit line BLf.

Next, referring to FIG. 10, in a sixth time interval T13, the program bit line voltage to be applied to the bit line BLg transitions from the second voltage level 2VL to the third voltage level 3VL or transitions from the second voltage level 2VL to the first voltage level 1VL. Therefore, for example, a fine program operation required for the memory cells MCn connected to the bit line BLg and released from the program inhibit state may be executed.

Next, referring to FIG. 10, in a seventh time interval T14, the program bit line voltage to be applied to the bit line BLh transitions from the second voltage level 2VL to the program voltage level PVL. Therefore, for example, additional program operations may be executed on the memory cells MCn connected to the bit line BLh.

Next, the program operation of the non-volatile memory device according to some embodiments will be described with reference to FIGS. 11 to 16.

FIGS. 11 to 16 are flowcharts for explaining the program operation of the non-volatile memory device according to some embodiments.

Figure 11:
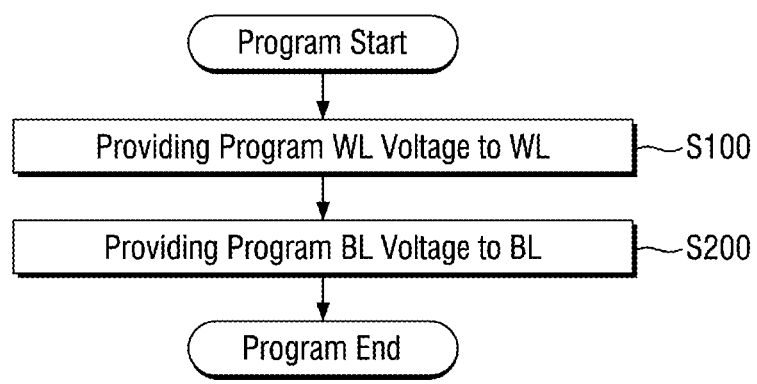
FIGS. 11 to 16 are flowcharts for explaining a program operation of the non-volatile memory device according to some embodiments.

Referring to FIG. 11, a program word line voltage is provided to a selected word line WL of a plurality of word lines (S100).

Specifically, a program word line voltage with a voltage level changed stepwise may be provided to the selected word line, for example, WLm. In some embodiments, although the voltage level of the program word line voltage may decrease by a first voltage level difference dV1 as shown in FIG. 5, the embodiments are not limited thereto.

Next, a program bit line voltage is provided to the plurality of bit lines (S200).

At this time, applying the program bit line voltage to the plurality of bit lines may be performed while the program word line voltage is provided to the selected word line WLm. Such an operation is the same in all the embodiments to be described below.

The program bit line voltage to be provided to the plurality of bit lines BLq may include transitions between various voltage levels. Hereinafter, a more specific description will be given with reference to FIGS. 12 to 19.

Figure 12:
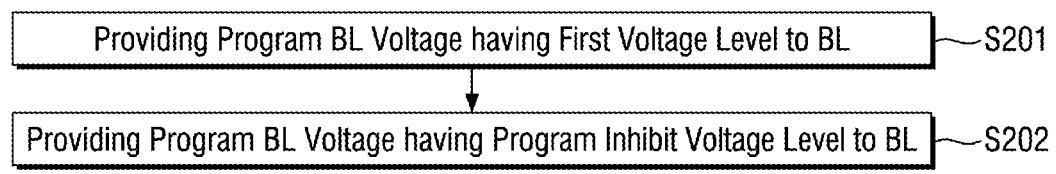

Referring to FIG. 12, a program bit line voltage having a first voltage level is provided to a plurality of bit lines (S201).

Here, the first voltage level may be a voltage level between a program inhibit voltage level for preventing the memory cells connected to the bit line to which the program bit line voltage is provided from being programmed, and a program voltage level for causing memory cells connected to the bit line to which the program bit line voltage is provided to be programmed.

In some embodiments, such a first voltage level may include a forcing voltage level to be provided to the bit line to improve threshold voltage dispersion of memory cells connected to the bit line to which the program bit line voltage is provided. However, the embodiments are not limited thereto.

Next, a program bit line voltage having a program inhibit voltage level is provided to a plurality of bit lines (S202).

In some embodiments, a program bit line voltage having a program inhibit voltage level may be provided to a plurality of bit lines, by transitioning a voltage level of a program bit line voltage to be provided to the bit line from a first level to a program inhibit voltage level.

Figure 13:
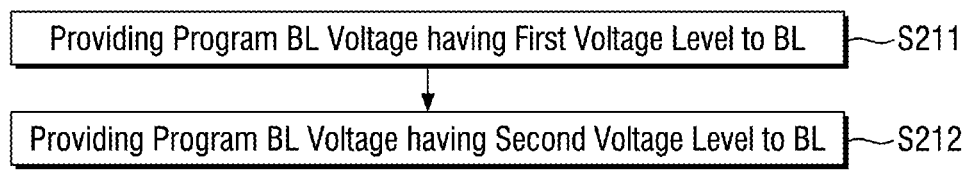

Referring to FIG. 13, a program bit line voltage having a first voltage level is provided to a plurality of bit lines (S211).

Since the first voltage level is the same as in the embodiment described above, the repeated explanation will not be provided, and the repeated explanation of the first voltage level will also not be provided below.

Thereafter, a program bit line voltage having a second voltage level is provided to the plurality of bit lines (S212).

In some embodiments, a program bit line having a second voltage level may be provided to a plurality of bit lines, by transitioning a voltage level of a program bit line voltage to be provided to the bit line from a first level to a second voltage level.

Here, the second voltage level may be a voltage level between the program inhibit voltage level and the program voltage level. In some embodiments, the second voltage level may be a voltage level having a voltage higher than the first voltage level. Also, in some embodiments, the second voltage level may be a voltage level having a voltage lower than the first voltage level.

Figure 14:
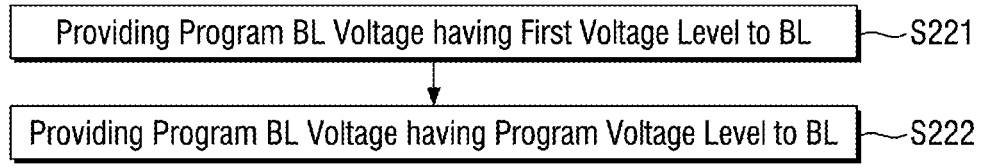

Referring to FIG. 14, a program bit line voltage having a first voltage level is provided to a plurality of bit lines (S221).

Thereafter, a program bit line voltage having a program voltage level is provided to a plurality of bit lines (S222).

In some embodiments, a program bit line voltage having a program voltage level may be provided to a plurality of bit lines, by transitioning a voltage level of a program bit line voltage to be provided to the bit line from the first voltage level to the program voltage level.

Figure 15:
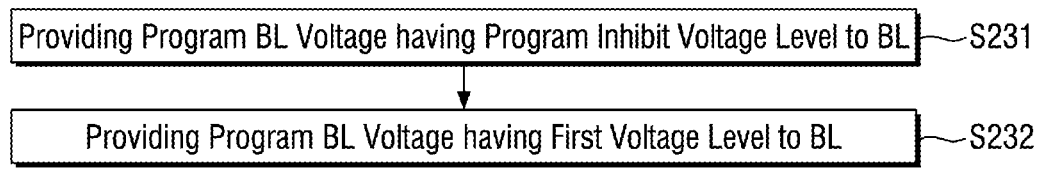

Referring to FIG. 15, a program bit line voltage having a program inhibit voltage level is provided to a plurality of bit lines (S231).

Thereafter, a program bit line voltage having a first voltage level is provided to the plurality of bit lines (S232).

In some embodiments, a program bit line voltage having a first voltage level may be provided to a plurality of bit lines, by transitioning a voltage level of a program bit line voltage to be provided to the bit line from the program inhibit voltage level to the first voltage level.

Figure 16:
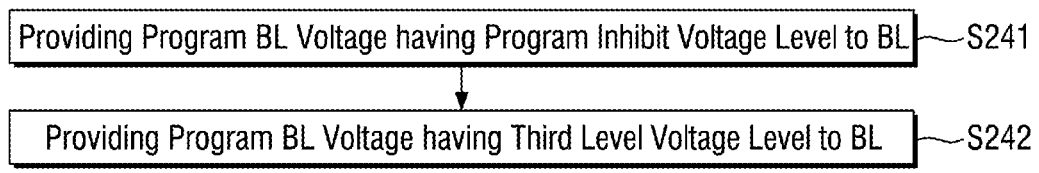

Referring to FIG. 16, a program bit line voltage having a program inhibit voltage level is provided to a plurality of bit lines (S241).

Thereafter, a program bit line voltage having a third voltage level is provided to the plurality of bit lines (S242).

In some embodiments, a program bit line voltage having a third voltage level may be provided to a plurality of bit lines, by transitioning a voltage level of a program bit line voltage to be provided to a bit line from the program inhibit voltage level to the third voltage level.

Here, the third voltage level may be a voltage level having voltage higher than the program inhibit voltage level.

In concluding the detailed description, those skilled in the art will appreciate that many variations and modifications may be made to the preferred embodiments without substantially departing from the principles of the present invention as set forth in the following claims. Therefore, the disclosed preferred embodiments of the invention are used in a generic and descriptive sense only and not for purposes of limitation.

What is claimed is:

1. A method for programming a non-volatile memory device, the method comprising:
    applying a program word line voltage with a voltage level changed stepwise to a selected word line connected to a plurality of memory cells, the program word line voltage including a first voltage level during a first time interval and a second voltage level different from the first voltage level during a subsequent second time interval;
    applying a program bit line voltage to a first bit line of a plurality of bit lines connected to a plurality of first memory cells, while the program word line voltage is applied to the selected word line;
    when the program bit line voltage has a program inhibit voltage level, inhibiting the plurality of first memory cells from programming; and
    when the program bit line voltage has a program voltage level, programming the plurality of first memory cells,
    wherein the program bit line voltage has a third voltage level between the program inhibit voltage level and the program voltage level during the first time interval, and one of the program inhibit voltage level, the program voltage level, and a fourth voltage level between the program inhibit voltage level and the program voltage level during the subsequent second time interval,
    wherein the program bit line voltage is maintained at the third voltage level during the first time interval, and
    wherein the second voltage level of the program word line voltage is lower than the first voltage level of the program word line voltage.

2. The method of claim 1, wherein the program inhibit voltage level is a power supply voltage level,
    wherein the program voltage level is a ground voltage level, and
    wherein the third voltage level is a forcing voltage level which is applied to the first bit line to improve threshold voltage dispersion of the plurality of first memory cells connected to the first bit line.

3. The method of claim 1, wherein the program bit line voltage has the program inhibit voltage level during the subsequent second time interval.

4. The method of claim 1, wherein the program bit line voltage has the fourth voltage level lower than the third voltage level during the subsequent second time interval.

5. The method of claim 1, wherein the program bit line voltage has the fourth voltage level higher than the third voltage level during the subsequent second time interval.

6. The method of claim 1, wherein the program bit line voltage has the program voltage level during the subsequent second time interval.

7. The method of claim 6, wherein the plurality of first memory cells are programmed to a predetermined program state by applying the program word line voltage and the program bit line voltage.

8. A method for programming a non-volatile memory device, the method comprising:
    applying a program word line voltage with a voltage level changed stepwise to a selected word line connected to a plurality of memory cells, the program word line voltage including a first voltage level during a first time interval and a second voltage level different from the first voltage level during a subsequent second time interval;
    applying a first program bit line voltage to a first bit line of a plurality of bit lines connected to a plurality of first memory cells, while the program word line voltage is applied to the selected word line;
    when the first program bit line voltage has a program inhibit voltage level, inhibiting the plurality of first memory cells from programming; and
    when the first program bit line voltage has a program voltage level, programming the plurality of first memory cells,
    wherein the first program bit line voltage has the program inhibit voltage level during the first time interval, and one of a third voltage level and a fourth voltage level between the program inhibit voltage level and the program voltage level during the subsequent second time interval,
    wherein the first program bit line voltage is maintained at the one of the third voltage level and the fourth voltage level during the subsequent second time interval, and
    wherein the second voltage level of the program word line voltage is lower than the first voltage level of the program word line voltage.

9. The method of claim 8, wherein the first program bit line voltage has the program inhibit voltage level during the first time interval, and the third voltage level during the subsequent second time interval.

10. The method of claim 9, wherein the program inhibit voltage level is a power supply voltage level,
    wherein the program voltage level is a ground voltage level, and
    wherein the third voltage level is a forcing voltage level which is applied to the first bit line to improve threshold voltage dispersion of the plurality of first memory cells connected to the first bit line.

11. The method of claim 8, wherein the first program bit line voltage has the program inhibit voltage level during the first time interval, and the fourth voltage level during the subsequent second time interval.

12. The method of claim 11, further comprising:
    while applying the first program bit line voltage to the first bit line, applying a second program bit line voltage to a second bit line of the plurality of bit lines connected to a plurality of second memory cells, the second program bit line voltage having the program inhibit voltage level during the first time interval, and the program voltage level during the subsequent second time interval.

13. The method of claim 12, wherein the first bit line and the second bit line are disposed adjacent to each other.

14. A method for programming a non-volatile memory device, the method comprising:
    applying a program word line voltage with a voltage level changed stepwise to a selected word line connected to a plurality of memory cells, the program word line voltage including a first voltage level during a first time interval and a second voltage level different from the first voltage level during a subsequent second time interval;

applying a first program bit line voltage to a first bit line of a plurality of bit lines connected to a plurality of first memory cells, while the program word line voltage is applied to the selected word line;

when the first program bit line voltage has a program inhibit voltage level, inhibiting the plurality of first memory cells from programming;

when the first program bit line voltage has a program voltage level, programming the plurality of first memory cells;

turning off a string selection transistor connected to the first bit line connected to the plurality of first memory cells, before the first program bit line voltage transitions to the program voltage level; and turning on the string selection transistor while applying the first program bit line voltage having the program voltage level and applying the program word line voltage such that the plurality of first memory cells are programmed to a predetermined program state.

15. The method of claim 14, further comprising:
applying a second program bit line voltage to a second bit line of the plurality of bit lines connected to a plurality of second memory cells, while the program word line voltage is applied to the selected word line,
wherein when the first program bit line voltage transitions from the program inhibit voltage level to the program voltage level, the second program bit line voltage transitions from the program inhibit voltage level to a third voltage level having a level higher than the program inhibit voltage level, and
wherein the first bit line and the second bit line are disposed adjacent to each other.

16. The method of claim 15, wherein the string selection transistor is turned off, before the second program bit line voltage transitions from the program inhibit voltage level to the third voltage level.

17. The method of claim 15, further comprising:
applying a third program bit line voltage to a third bit line of the plurality of bit lines connected to a plurality of third memory cells, while the program word line voltage is applied to the selected word line,
wherein when the first program bit line voltage transitions from the program inhibit voltage level to the program voltage level, the third program bit line voltage transitions from the program inhibit voltage level to a fourth voltage level lower than the program inhibit voltage level and higher than the program voltage level.

18. The method of claim 15, wherein the string selection transistor is turned on while applying the first program bit line voltage having the program voltage level to the first bit line and after transitioning the second program bit line voltage from the third voltage level to the program inhibit voltage level.

19. The method of claim 14, further comprising:
applying a second program bit line voltage to a second bit line of the plurality of bit lines connected to a plurality of second memory cells, while the program word line voltage is applied to the selected word line,
wherein when the first program bit line voltage transitions from the program inhibit voltage level to the program voltage level, the second program bit line voltage transitions from the program inhibit voltage level to a third voltage level lower than the program inhibit voltage level and higher than the program voltage level.

* * * * *